US008493162B1

(12) United States Patent
Podell

(10) Patent No.: US 8,493,162 B1
(45) Date of Patent: Jul. 23, 2013

(54) COMBINER/DIVIDER WITH COUPLED TRANSMISSION LINE

(75) Inventor: Allen F. Podell, Palo Alto, CA (US)

(73) Assignee: Werlatone, Inc., Brewster, NY (US)

(*) Notice: Subject to any disclaimer, the term of this patent is extended or adjusted under 35 U.S.C. 154(b) by 0 days.

(21) Appl. No.: 13/586,649

(22) Filed: Aug. 30, 2012

Related U.S. Application Data

(63) Continuation-in-part of application No. 13/586,684, filed on Aug. 15, 2012, and a continuation-in-part of application No. 13/586,714, filed on Aug. 15, 2012.

(51) Int. Cl.
*H03H 7/38* (2006.01)
*H01P 5/12* (2006.01)

(52) U.S. Cl.
USPC ........... 333/131; 333/125; 333/134; 333/136; 333/26

(58) Field of Classification Search
USPC ................... 333/125–129, 132, 134, 136, 25, 333/26, 131
See application file for complete search history.

(56) References Cited

U.S. PATENT DOCUMENTS

| | | | | |
|---|---|---|---|---|
| 3,239,781 | A | 3/1966 | Podell | |
| 3,311,850 | A | 3/1967 | Podell | |
| 3,325,587 | A | 6/1967 | Sontheimer | |
| 3,327,220 | A | 6/1967 | Podell | |
| 3,399,340 | A | 8/1968 | Podell | |
| 3,508,171 | A | 4/1970 | Podell | |
| 4,647,868 | A * | 3/1987 | Mueller | 330/286 |
| 4,774,481 | A * | 9/1988 | Edwards et al. | 333/127 |
| 4,916,410 | A * | 4/1990 | Littlefield | 330/295 |
| 5,121,090 | A * | 6/1992 | Garuts et al. | 333/124 |
| 5,285,175 | A * | 2/1994 | Edwards | 333/109 |
| 5,461,349 | A * | 10/1995 | Simons | 333/109 |
| 5,745,017 | A * | 4/1998 | Ralph | 333/116 |
| 5,982,252 | A | 11/1999 | Werlau | |
| 6,246,299 | B1 | 6/2001 | Werlau | |
| 6,407,648 | B1 | 6/2002 | Johnson | |
| 6,486,749 | B1 * | 11/2002 | Tichauer et al. | 333/125 |
| 6,750,752 | B2 | 6/2004 | Werlau | |
| 7,692,512 | B2 | 4/2010 | Podell | |
| 2011/0074519 | A1 | 3/2011 | Podell | |

OTHER PUBLICATIONS

U.S. Appl. No. 13/586,684, filed Aug. 15, 2012; inventor Allen F. Podell title Combiner/Divider with Interconnection Structure.
U.S. Appl. No. 13/586,684, filed Aug. 15, 2012; inventor Allen F. Podell; title Planar Circuit Structures.

* cited by examiner

*Primary Examiner* — Robert Pascal
*Assistant Examiner* — Kimberly Glenn
(74) *Attorney, Agent, or Firm* — Kolisch Hartwell, PC

(57) ABSTRACT

A combiner/divider circuit may include a plurality of transmission lines forming a junction, a sum port, a first component port, a second component port, and a difference port. A transmission line may be associated with the difference port and may be formed by inductively coupling a portion of each of two other transmission lines. The difference port may be terminated by a terminating impedance element at a location spaced apart from the junction, with the inductively coupled portions being between the junction and the terminating impedance element.

17 Claims, 2 Drawing Sheets

COMBINER/DIVIDER WITH COUPLED TRANSMISSION LINE

CROSS-REFERENCE TO RELATED APPLICATIONS

This application is a continuation-in-part of application Ser. No. 13/586,684 filed Aug. 15, 2012 and application Ser. No. 13/586,714 filed Aug. 15, 2012.

BACKGROUND

This application is directed to combiner/divider circuits. High power broadband communication systems require high power broadband antennas. Often these antennas have an input impedance that does not match the desired transmitter or receiver with which it is used. In such circumstances, baluns can be used to transform the impedance of the antenna to the impedance of the transmitter or receiver, or to convert between an unbalanced signal and a balanced signal. When large bandwidths are desired, coaxial baluns are often used.

Simple signal sources have two terminals, a source terminal and a return terminal, where most commonly a ground plane is used for the return path. The ground plane return simplifies circuit wiring, as a single conductor and the ground plane form a complete signal path. The voltage on the ground plane is then the reference for this signal. Often this is referred to as an "unbalanced circuit," or "single ended circuit." In such unbalanced circuits, when wires cross or run parallel with one another, there can be undesired coupling.

One method for reducing such coupling is to use two conductors, one for the signal, the other for the signal return path, eliminating the ground plane return path. This is referred to as a "balanced" or "differential" circuit. In AC signals, either conductor can be considered to be the signal, and the other the signal-return. To minimize coupling to other circuits, it is highly desired that the signal current flowing in the two conductors be exactly the same, and 180 degrees out of phase. That is, all of the return current for one conductor of the pair is carried by the other conductor, and the circuit is balanced. This results in zero current being carried by the ground plane. In practice, such perfectly balanced currents are only a theoretical goal.

An amplifier that uses balanced or differential input and output connections is less likely to have oscillations caused by coupling of the input and output signals, and will have less extraneous noise introduced by the surrounding circuitry. For this reason, practically all high gain operational amplifiers are differential. A "balun" (short for "balanced-unbalanced") is a component that converts between an unbalanced source and a balanced one. Some baluns are constructed with nearly complete isolation between the balanced terminals and ground. Some baluns are constructed with each balanced terminal referenced to ground, but with equal and opposite voltages appearing at these terminals. These are both valid baluns, but in the first case, the unbalanced voltage encounters high impedance to ground, making unbalanced current flow difficult, while in the second, any unbalanced current encounters a short circuit to ground, minimizing the voltage that enters the balanced circuit.

Microwave baluns can be either of these types, or even a mixture of the two. In any case, one could connect two equal unbalanced loads to the two balanced terminals, with their ground terminals connected together to ground. Ideally, the unbalanced signal input to the balun would be equally distributed to the two unbalanced loads. Thus, a balun could be used as a power divider or combiner, where the two unbalanced loads or sources connected to the balanced terminals would be operating 180 degrees out of phase.

SUMMARY

In one example, a combiner/divider circuit may include first, second, third, fourth, and fifth transmission lines, each having a signal conductor and a signal-return conductor. The signal-return conductors of the first, second, and third transmission lines at respective first ends of the first, second, and third transmission lines may be connected together. The signal conductor of the first transmission line at a second end of the first transmission line may form a sum port. The signal conductor of the second transmission line at the first end of the second transmission line may be connected to the signal-return conductor of the fourth transmission line at a first end of the fourth transmission line. The signal conductor of the third transmission line at the first end of the third transmission line may be connected to the signal-return conductor of the fifth transmission line at a first end of the fifth transmission line. The signal conductor of the first transmission line at the first end of the first transmission line may be connected to the signal conductors of both the fourth and the fifth transmission lines at respective first ends of the fourth and fifth transmission lines. At least a portion of the signal-return conductor of the fourth transmission line may be inductively coupled to at least a portion of the signal-return conductor of the fifth transmission line at the respective first ends of the fourth and fifth transmission lines. The signal conductors at respective second ends of the third and fourth transmission lines may form a first component port, and the signal conductors at respective second ends of the second and fifth transmission lines may form a second component port. The inductively coupled portions of the signal-return conductors of the fourth and fifth transmission lines may form a sixth transmission line conducting a difference signal representative of a difference between signals occurring on the first and second component ports.

DETAILED DESCRIPTION

Various examples of combiner/dividers 10 are depicted generally in FIGS. 1-4. Unless otherwise specified, a combiner/divider 10 may, but is not required to contain one or more of the exemplary structure, components, functionality, and/or variations described, illustrated, and/or incorporated herein.

Figure 1:
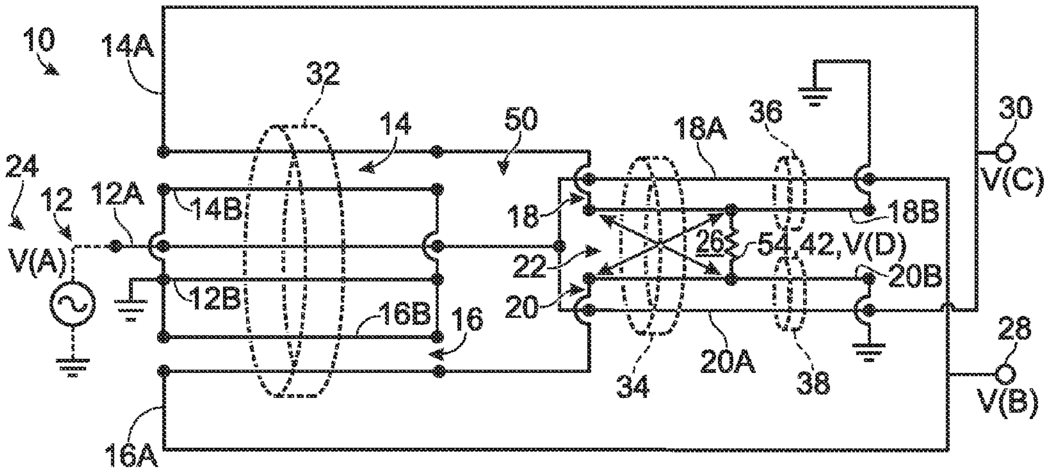
FIG. 1 is a circuit diagram showing an illustrative combiner/divider.
Figure 2:
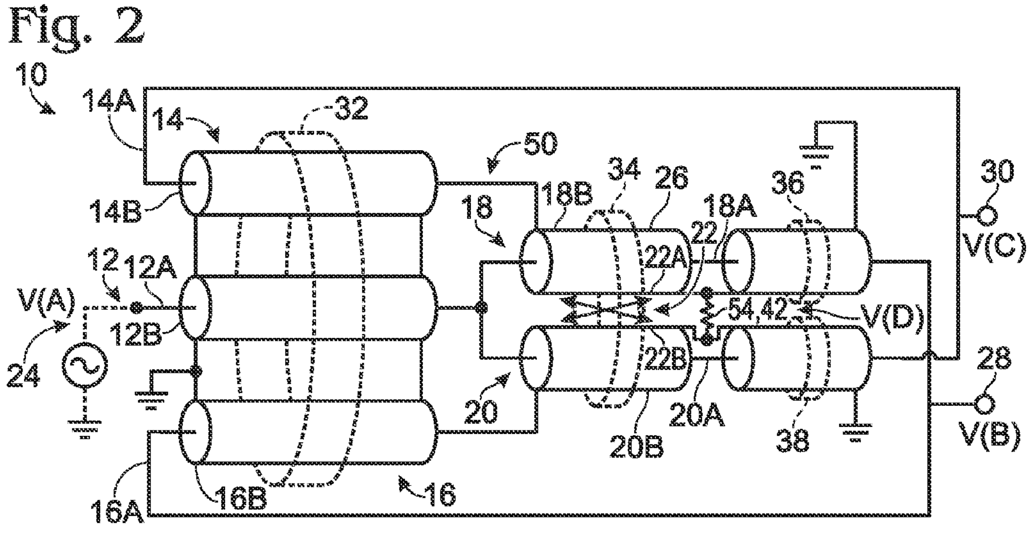
FIG. 2 is a diagram showing an embodiment of the combiner/divider of FIG. 1 including coaxial cables.

As depicted in FIGS. 1 and 2, combiner/divider 10 may include a plurality of transmission lines such as first transmission line 12, second transmission line 14, third transmission line 16, fourth transmission line 18, fifth transmission line 20, and sixth transmission line 22. When used as a magic-tee hybrid combiner/divider, one end of a signal conductor 12B of transmission line 12 may be a sum port 24. One end of a signal-return conductor 18B or 20B of a respective one of transmission lines 18 and 20 may be a difference port 26. One end of a signal conductor 16A of transmission line 16 may be connected to an end of a signal conductor 18A of transmission line 18, which connection may be a first component port 28. Similarly, a first end of a signal conductor 14A of transmission line 14 may be connected to a first end of a signal conductor 20A of transmission line 20, which connection may be a second component port 30. Each port may be a place where characteristics of combiner/divider 10 may be defined, whether accessible or not. A combiner/divider may also be referred to as a combiner/divider circuit, a divider/combiner, a divider, or a combiner, it being understood that signals and power may be conducted in either direction through them to either combine multiple inputs into a single output or to divide a single input into multiple outputs.

Each one of transmission lines 12, 14, 16, 18, 20, and 22 may be constructed as one of various forms well known in the art. For example, a transmission line may be a coaxial transmission line, twisted pair, strip line, coplanar waveguide, slot line, or microstrip line. Whatever the form, each transmission line may include a pair of electrically spaced apart, inductively coupled conductors that conduct or transmit a signal defined by a voltage difference between the conductors.

These conductors may be described interchangeably as a signal conductor and a signal-return conductor. In the drawings, signal conductors are given the designation "A" and signal-return conductors are given the designation "B." For example, the signal conductor of transmission line 12 is designated with reference numeral 12A and the signal-return conductor of transmission line 12 is designated with reference numeral 12B. Other transmission lines are designated in similar fashion. Accordingly, transmission lines 14, 16, 18, 20, and 22 have signal conductors 14A, 16A, 18A, 20A, and 22A, and signal-return conductors 14B, 16B, 18B, 20B, and 22B. As is discussed further below, in the examples shown in the figures, portions of signal return conductors 18B and 22B form signal conductor 22A and signal-return conductor 22B, respectively, of transmission line 22.

Figure 3:
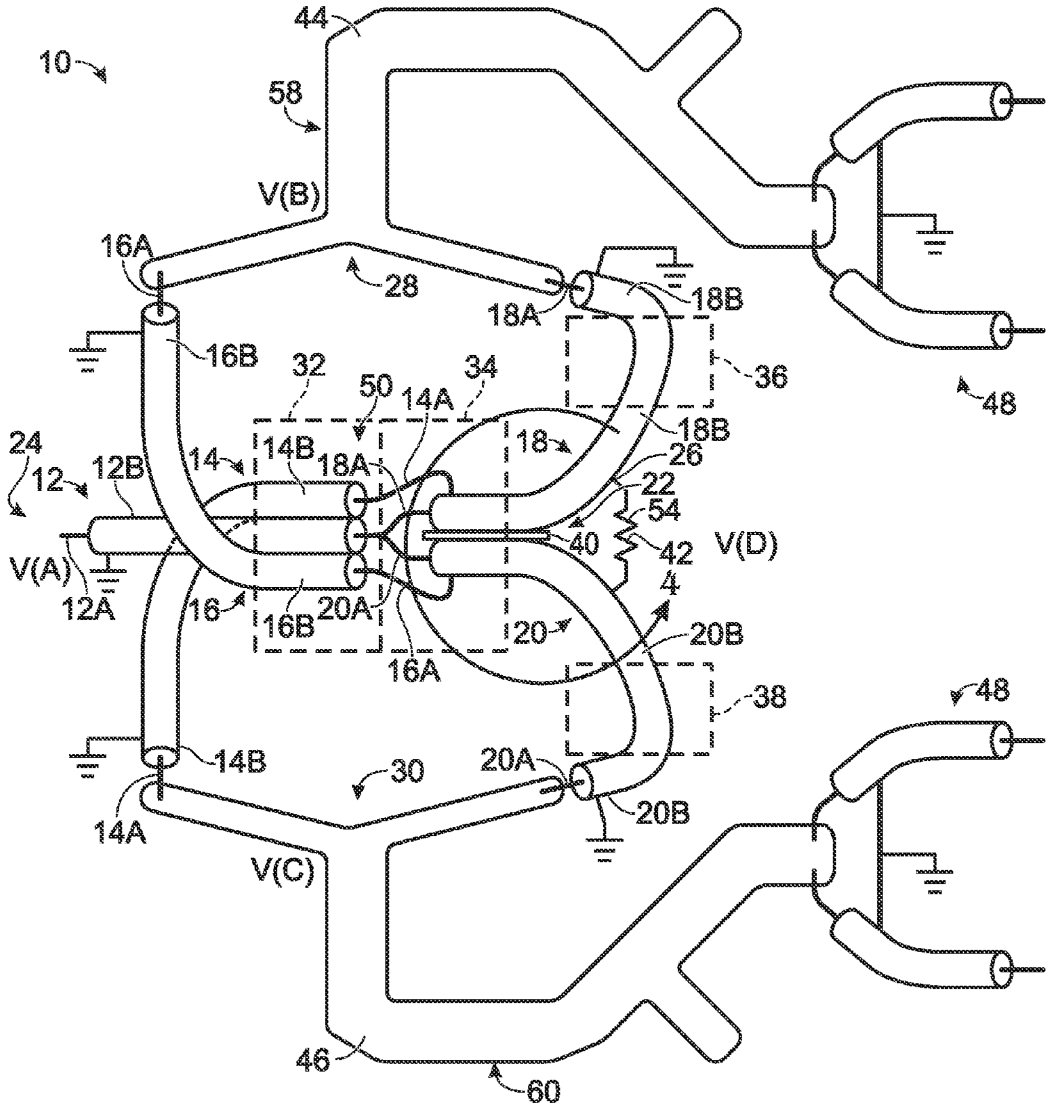
FIG. 3 shows an example of a combiner/divider including the circuit illustrated in FIG. 1.

In some types of transmission lines a signal-return conductor may be a shield conductor, as in a coaxial transmission line, as shown in FIGS. 2 and 3, or a strip line. A signal-return conductor may also be referred to as a ground conductor, whether or not it is connected to a local ground, a circuit ground, a system ground, or an earth ground. A signal conductor may be referred to as a shielded conductor or as a center conductor, such as in a coaxial transmission line as shown in FIGS. 2 and 3. Transmission lines 12, 14, 16, 18, 20, and 22 may also have differing lengths depending on the intended phase relationships desired. In some examples, transmission lines 14, 16, 18, and 20 may have equal lengths.

Combiner/divider 10 may also include one or more ferrite sleeves, such as a first ferrite sleeve 32 extending around transmission lines 12, 14, and 16, a second ferrite sleeve 34 extending around transmission lines 18, 20, and 22, a third ferrite sleeve 36 extending around only transmission line 18 spaced from transmission line 22, and/or a fourth ferrite sleeve 38 extending around only transmission line 20 spaced from transmission line 22.

Transmission lines may be configured to form baluns, where an unbalanced signal exists at one end of the transmission line where the signal-return conductor is connected to circuit ground, and a balanced signal exists at the other end of the transmission line. The voltage difference between the signal and signal-return conductors stays the same along the transmission line, but the voltage on each conductor relative to ground gradually changes progressing from the unbalanced-signal end toward the balanced-signal end. At the balanced-signal end, the voltage relative to circuit ground on the signal conductor may be half the voltage on the signal conductor at the unbalanced-signal end, and the voltage on the signal-return conductor may be the negative complement of the voltage on the signal conductor. This arrangement leads to a voltage variation or gradient along the length of the transmission line relative to circuit ground, because the voltages on the signal conductor and the signal-return conductor transition between the different voltages at each end.

The structure of the balun may produce spurious signals between a conductor and circuit ground, which spurious signals may be choked by a ferrite sleeve extending around the conductor. A ferrite sleeve may be a block, bead, or ring, or layers of ferrite material may be configured as appropriate to suppress high frequency spurious signals, noise, or other signals relative to ground on the transmission line. Transmission lines having unshielded conductors with the same voltage to ground may use a common ferrite sleeve. Combining transmission lines in a single ferrite sleeve may reduce overall hysteresis losses caused by the ferrite.

Turning now to the examples depicted in FIGS. 1 and 2, illustrative combiner/dividers are shown. FIG. 1 illustrates a combiner/divider 10 in which the transmission lines are represented as wire conductors. The reference numbers of the components and features used for the circuit of FIG. 1 are also used for the circuit of FIG. 2, which circuit is described below. The center conductor of a coaxial transmission line is also referred to herein as the signal conductor. Accordingly, the shield conductor surrounding the center conductor is also referred to below as the signal-return conductor.

To provide a frame of reference in the following description, one end of each of transmission lines 12, 14, 16, 18, and 20 are connected together at what is referred to as a junction 50. The ends of the transmission lines that are connected together at junction 50 are referred to as the first ends, and the ends opposite the first ends are referred to as the second ends. Using this terminology, sum port 24 is at the second end of the signal conductor 12A of transmission line 12; the connection of the second ends of signal conductors 16A and 18A forms component port 28; and the connection of the second ends of signal conductors 14A and 20A forms component port 30.

Furthermore, in the following discussion instantaneous voltages existing at each of the ports, depending upon the circuit application, are designated as follows: V(A) is at sum port 24, V(B) is at first component port 28, V(C) is at second component port 30, and V(D) is at difference port 26.

In this example of combiner/divider 10, the first ends of signal-return conductors 12B, 14B, and 16B of the first, second, and third transmission lines, respectively, are connected together electrically by connecting the respective coaxial shields to one another.

The second end of first transmission line 12 forms sum port 24, the second end of second transmission line 14 is associated with second component port 30, and the second end of third transmission line 16 is associated with first component port 28. Signal-return conductors 12B, 14B, and 16B of these three transmission lines are connected to ground at their respective second ends. Since the signal-return conductors 12B, 14B, and 16B are each grounded at one end and connected together electrically at the other end, they have the same voltage with respect to ground and may be choked using the same ferrite sleeve, such as first ferrite sleeve 32.

In this example, the second end of signal conductor 12A is associated with sum port 24. The first end of signal conductor 12A may be connected in junction 50 to the first ends of signal conductor 18A and signal conductor 20A in a branching configuration as shown in FIGS. 1 and 2. The first end of signal conductor 14A may be electrically connected to the first end of signal-return conductor 18B, for example by connecting the center conductor of second transmission line 14 in junction 50 to the shield of fourth transmission line 18. In similar fashion, the first end of signal conductor 16A may be electrically connected to the first end of signal-return conductor 20B, for example by connecting the center conductor of third transmission line 16 to the shield of fifth transmission line 20.

The first ends of fourth transmission line 18 and fifth transmission line 20 may be spaced electrically along a length to provide inductive coupling between signal-return conductor 18B and signal-return conductor 20B, forming thereby sixth transmission line 22. To facilitate this coupling, a layer of dielectric material 40 may be disposed between the shields of fourth transmission line 18 and fifth transmission line 20. At least a portion of the transmission lines along the coupled lengths of transmission lines 18 and 20, and thereby along transmission line 22, may be surrounded by a ferrite sleeve, such as second ferrite sleeve 34.

Coupling the signal-return conductors of fourth transmission line 18 and fifth transmission line 20 in this fashion may create difference port 26 as a differential voltage V(D) flowing along transmission line 22 between the coaxial shields 18B and 20B. Differential voltage V(D) of difference port 26 may be terminated by a terminating impedance 54. Coupling signal-return conductors 18B and 20B allows relocation of the termination impedance of difference port 26 away from the first ends of transmission lines 18 and 20 at hybrid junction 50.

When acting as a divider with a voltage applied at sum port 24, the input voltage travels down transmission line 12 to junction 50. Ideally, at this point, the voltage is divided equally, with a voltage V(A)/2 appearing across the first ends of transmission lines 18 and 20, and an equal voltage V(A)/2 appearing across the first ends of transmission lines 14 and 16. The voltage across the first end of transmission line 14 is the same as the voltage from the shield of transmission line 18 to the shield of transmission line 14, and the voltage across the first end of transmission line 16 is the same as the voltage from the shield of transmission line 20 to the shield of transmission line 16.

Eventually, the shields of these four lines connect to ground. If one assumes that at high frequencies the ferrite loss may be represented by a resistance from the first end to the second end of the shield of R ohms, then that loss will be least when the shield to ground voltages are equal, and are V(A)/4. Ideally, the shield voltage on coax lines 14 and 16, measured at junction 50 is −V(A)/4, and that on the shields of lines 18 and 20 is +V(A)/4. Anything that causes currents to flow to ground and that will unbalance these voltages will increase the ferrite loss. It is preferred, then, that a high power terminating resistor not be located across the shields of line 18 and 20, as this termination will have a large capacitance to ground as a consequence of the need for dissipating heat produced by the resistor to ground. That excess capacitance will unbalance junction 50, and result in increased ferrite loss.

Transmission line 22 formed by the shields of lines 18 and 20, with a possible dielectric 40, enables relocating terminating resistance 54 to a location outside ferrite sleeve 34, thereby lowering the ferrite loss. The preferred implementation of junction 50 contains minimal interconnections between lines 12, 14, 16, 18 and 20, with an effectively continuous sleeve of ferrite 32, 34 surrounding it. As the termination 54 is now across from shield to shield, choking those shields with ferrite sleeves 36 and 38 prevents shorting out the termination as the shields connect to ground.

Transmission line 22 may have an impedance that is equivalent to the impedance of termination impedance 54 of difference port 26. The arrangement depicted in FIGS. 2 and 3 may cause the voltage to drop by V(A)/4 between sum port 24 and junction 50, and drop by the remaining voltage drop V(A)/4 between junction 50 and the termination of difference port 26. Two ferrite sleeves, for example first ferrite sleeve 32 and second ferrite sleeve 34, as shown in the drawings, may then each choke a voltage drop of V(A)/4.

If the entire V(A)/2 voltage drop occurs between sum port 24 and junction 50, a single ferrite sleeve may be used. In the arrangement of this example with a voltage drop spread over two ferrite sleeves, total losses may be proportional to $2\times V^2(A)/16$, or $V^2(A)/8$. With a voltage drop of V(A)/4 between sum port 24 and junction 50, $I^2R$ losses may be reduced by 50% by ferrite sleeve 32 on transmission line 12.

In some examples, differential voltage V(D) may be applied across impedance 54, corresponding to port 26. Impedance 54 may be in the form of a resistor 42. The shield-to-shield impedance of transmission line 22 between signal-return conductor 18B and signal-return conductor 20B may be 50 ohms, for example. Accordingly, resistor 42 may be a 50-ohm resistor.

Figure 4:
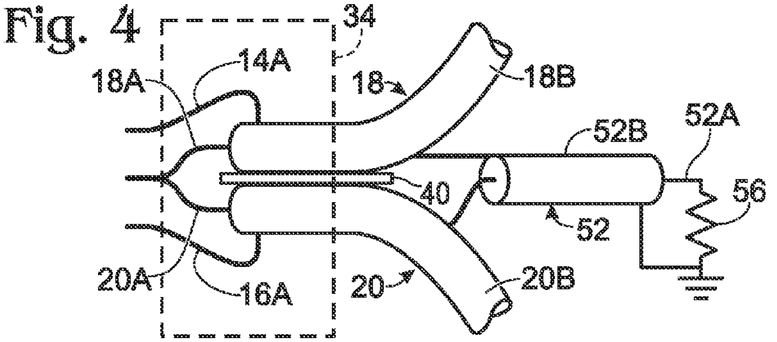
FIG. 4 shows another embodiment of a portion of the combiner/divider of FIG. 3.

Referring to FIG. 4, a second example of a termination for transmission line 22 is illustrated. In this example, terminating impedance 54 may be provided by a seventh transmission line 52, shown as a coaxial transmission line with a first end of a center, signal conductor 52A electrically connected to signal-return conductor 20B and a first end of a shield, signal-return conductor 52B electrically connected to signal-return conductor 18B. An opposite, second end of center conductor 52A of coaxial transmission line 52 may in turn be terminated by an impedance 56 connected to ground. A second end of shield conductor 52B may be connected to ground.

When combiner/divider device 10 is used as a magic tee hybrid, an input voltage may be applied across termination impedance 54 at difference port 26. Accordingly, a high impedance to ground may be provided for shield conductors 18B and 20B at difference port 26 by choking each of them with a ferrite sleeve, such as third and fourth ferrite sleeves 36 and 38, respectively. The second ends of signal-return conductors 18*b* and 20*b* may then be grounded. Alternatively, the coaxial shields of coaxial transmission lines 18 and 20 may be put through a single ferrite sleeve in opposite directions, and then grounded.

FIG. 3 illustrates a four-way combiner/divider device 58 that may include a combiner/divider device 10 as described with reference to FIGS. 1 and 2. As discussed above with reference to combiner/divider device 10, the second ends of signal conductor 16A of third transmission line 16 and signal conductor 18A of fourth transmission line 18 may be connected to form first component port 28. This connection may be provided by a planar signal conductor 44 of a first planar transmission line 58, such as a microstrip or a stripline. Signal conductor 44 may extend between the second ends of signal conductor 16A and signal conductor 18A.

Similarly, the second ends of signal conductor 14A of second transmission line 14 and the signal conductor 20A of fourth transmission line 20 may be connected to form second component port 30. This connection may be provided by a planar signal conductor 46 of a second planar transmission line 60. Signal conductor 46 may extend between the second ends of signal conductor 14A and signal conductor 20A. Also shown in FIG. 3, a respective splitter 48 may be electrically connected to an end of first planar signal conductor 44 opposite port 28 and to an end of second planar signal conductor 46 opposite port 30 to further divide or combine respective signals carried on planar transmission lines 58 and 60.

Referring to FIGS. 1-3 generally, second transmission line 14, third transmission line 16, fourth transmission line 18, and fifth transmission line 20 may each have a respective length. In order to provide appropriate signal phases at the respective ends of these transmission lines, for example, the combined lengths of lines 14 and 18 may be substantially the same as the combined lengths of lines 16 and 20. In some embodiments, the lengths of all four transmission lines may be substantially the same.

With the described configuration, combiner/divider 10 may be utilized as either a divider or a combiner, depending on which port or ports have signals applied, and may be configured as a magic tee hybrid having the following conditions:

| Signal Input | Result |
|---|---|
| V(A) | V(D) = 0;<br>V(B) = +V(A)/2;<br>V(C) = +V(A)/2 |
| V(B) and V(C) | V(A) = V(B) + V(C);<br>V(D) = V(C) − V(B) |
| V(D) | V(A) = 0;<br>V(B) = −V(D)/2;<br>V(C) = +V(D)/2 |

For example, when functioning as a divider, an unbalanced signal may be applied at sum port 24 by applying voltage V(A) to the second end of first signal conductor 12A. At the first end of signal conductor 12A, the signal is partially balanced between signal conductor 12A and signal-return conductor 12B, with 3V(A)/4 on the signal conductor and −V(A)/4 on the signal-return conductor. Accordingly, because in this example signal-return conductors 12B, 14B, and 16B are all connected together, a voltage of −V(A)/4 exists on the first ends of all three of these signal-return conductors.

Correspondingly, a V(A)/4 voltage exists on the first ends of signal conductors 14A and 16A, resulting in a balanced signal with amplitude V(A)/2 on the first ends of each of transmission lines 14 and 16. With the second ends of signal-return conductors 14B and 16B grounded at the component terminals, the balanced signal applied to the first ends of the signal conductors of second transmission line 14 and third transmission line 16 are unbalanced at the component ports 28 and 30. The full voltage V(A)/2 occurs on the second ends of respective signal conductors 14A and 16A. Accordingly, voltages V(B) and V(C) equal +V(A)/2.

With voltage V(A)/4 on the first end of each of signal conductors 14A, and 16A, voltage V(A)/4 is applied to the first ends of the signal-return conductors of transmission lines 18 and 20. With 3V(A)/4 on the first end of signal conductor 12A, 3V(A)/4 is applied to the first ends of the signal conductors of transmission lines 18 and 20. Because signals having an amplitude of V(A)/2 exist on both of the first ends of the signal-return conductors of fourth transmission line 18 and fifth transmission line 20, voltage V(D) appearing across impedance 54 at difference port 26 is zero.

If instead, a balanced signal having a voltage V(D) is applied across impedance 54 at difference port 26, a voltage +V(D)/2 exists on signal-return conductor 18B at port 26 and a voltage −V(D)/2 exists on signal-return conductor 20B at port 26. The sum of these applied signals appears on sum port 24, which sum is equal to zero due to the cancelation of the voltages of opposite polarity on center conductors 18A and 20A, as well as on shield conductors 18B and 20B in junction 50. However, the second ends of transmission lines 18 and 20 are each unbalanced, and thus a signal voltage of −V(D)/2 exists at the second end (port 28) of signal conductor 18A and a signal voltage of +V(D)/2 exists at the second end (port 30) of signal conductor 20A. Accordingly, voltage V(B) is −V(D)/2 and voltage V(C) is +V(D)/2. These voltages induce signals in signal-return conductors 14B and 16B. However, the first ends of signal-return conductors 14B and 16B are connected, and the out-of-phase signals cancel each other out at the first ends. Accordingly, the zero voltage at sum port 24 remains unaffected.

Combiner/divider 10 may also be used as a combiner. For example, voltages V(B) and V(C) may be applied at component ports 28 and 30, respectively. In this example, an unbalanced voltage V(B) is applied to port 28, and thereby to the respective second ends of signal conductors 16A and 18A. The signal becomes a balanced signal as it transitions to the first ends of transmission lines 16 and 18, producing a voltage V(B)/2 on the signal conductors and a voltage −V(B)/2 on the signal-return conductors. Likewise, an unbalanced voltage V(C) is applied to port 30, and thereby to the second ends of signal conductors 14A and 20A. The signals become balanced signals as they transition to the first ends of transmission lines 14 and 20, producing a voltage V(C)/2 on the signal conductors and a voltage −V(C)/2 on the signal-return conductors.

However, the first ends of the signal-return conductors of transmission lines 14 and 16, namely signal-return conductors 14B and 16B, are connected to each other and to the first end of signal-return conductor 12B. Accordingly, all of these signal-return conductors at the first end must have the same potential. In this case, instead of having voltages −V(B)/2 and −V(C)/2, the two signals combine to produce a signal having a voltage of [−V(B)/2+−V(C)/2] at the first ends of signal-return conductors 12B, 14B, and 16B.

The voltage on the first end of signal conductor 12A is the sum of the voltages occurring on signal conductors 18A and 20A. Transmission line 18 has an unbalanced voltage V(B) applied to the second end of the signal conductor, and transmission line 20 has an unbalanced voltage V(C) applied to the second end of the signal conductor. Therefore, in the process of becoming balanced at the first end, each of the signal conductors of these transmission lines may have one half of these voltages, i.e., voltages V(B)/2 and V(C)/2, respectively, As a result, the signal applied to signal conductor 12A may have a voltage [V(B)/2+V(C)/2].

Because the signal on the first end of transmission line 12 is balanced and the signal on the second end is unbalanced, the signal on the second end of signal conductor 12A corresponds to the difference between the voltages existing on the first ends of the signal conductor and the signal-return conductor. In other words, the voltage at the second end of signal conductor 12A, which is sum port 24, is [V(B)/2+V(C)/2] minus [−V(B)/2−V(C)/2], or V(B)+V(C).

As mentioned in this example, transmission line 18 has an unbalanced voltage V(B) applied to the second end, and transmission line 20 has an unbalanced voltage V(C) applied to the second end. Therefore, in the process of becoming balanced at the first end, each of the signal-return conductors of these transmission lines may have one half of the negative of this voltage, i.e., voltages −V(B)/2 and −V(C)/2, respectively, on the first ends of signal-return conductors 18B and 20B.

Accordingly, the voltage V(C)/2 from signal conductor 14A is applied to signal-return conductor 18B, carrying voltage −V(B)/2 and voltage V(B)/2 from signal conductor 16A to signal-return conductor 20B carrying voltage −V(C)/2. This results in [V(C)/2-V(B)/2] on signal-return line 18B and [V(B)/2−V(C)/2] on signal-return line 20B. However, it is important again to note that signal-return lines 18B and 20B are inductively coupled to form sixth transmission line 22. At difference port 26, the difference between these two signals, V(D), is [V(C)/2−V(B)/2] minus [V(B)/2−V(C)/2], which simplifies to V(C)−V(B), the difference between the two signals applied to component ports 28 and 30.

The above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled. Accordingly, while embodiments of a combiner/divider have been particularly shown and described, many variations may be made therein. This disclosure may include one or more independent or interdependent inventions directed to various combinations of features, functions, elements and/or properties, one or more of which may be defined in the following claims. Other combinations and sub-combinations of features, functions, elements and/or properties may be claimed later in this or a related application. Such variations, whether they are directed to different combinations or directed to the same combinations, whether different, broader, narrower or equal in scope, are also regarded as included within the subject matter of the present disclosure. An appreciation of the availability or significance of claims not presently claimed may not be presently realized. Accordingly, the foregoing embodiments are illustrative, and no single feature or element, or combination thereof, is essential to all possible combinations that may be claimed in this or a later application. Each claim defines an invention disclosed in the foregoing disclosure, but any one claim does not necessarily encompass all features or combinations that may be claimed.

Where the claims recite "a" or "a first" element or the equivalent thereof, such claims include one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated. Ordinal indicators may be applied to associated elements in the order in which they are introduced in a given context, and the ordinal indicators for such elements may be different in different contexts.

INDUSTRIAL APPLICABILITY

The methods and apparatus described in the present disclosure are applicable to radio frequency communications, radar, and other industries in which combiner/divider devices are used.

The invention claimed is:

1. A combiner/divider circuit comprising:

first, second, third, fourth, and fifth transmission lines, each having a signal conductor and a signal-return conductor;

the signal-return conductors of the first, second, and third transmission lines at respective first ends of the first, second, and third transmission lines being connected together;

the signal conductor of the first transmission line at a second end of the first transmission line forming a sum port;

the signal conductor of the second transmission line at the first end of the second transmission line being connected to the signal-return conductor of the fourth transmission line at a first end of the fourth transmission line;

the signal conductor of the third transmission line at the first end of the third transmission line being connected to the signal-return conductor of the fifth transmission line at a first end of the fifth transmission line;

the signal conductor of the first transmission line at the first end of the first transmission line being connected to the signal conductors of both the fourth and the fifth transmission lines at respective first ends of the fourth and fifth transmission lines;

the signal conductors at respective second ends of the third and fourth transmission lines forming a first component port, and the signal conductors at respective second ends of the second and fifth transmission lines forming a second component port;

at least a portion of the signal-return conductor of the fourth transmission line being inductively coupled to at least a portion of the signal-return conductor of the fifth transmission line at the respective first ends of the fourth and fifth transmission lines, forming a sixth transmission line, the sixth transmission line conducting a difference signal representative of a difference between signals occurring on the first and second component ports and terminated by a terminating impedance connected between the signal-return conductors of the fourth and fifth transmission lines at a position spaced from the first ends of the fourth and fifth transmission lines.

2. The combiner/divider circuit of claim 1, wherein the first transmission line has a characteristic impedance and the sixth transmission line has an impedance substantially equal to the characteristic impedance.

3. The combiner/divider circuit of claim 1, further comprising a first ferrite sleeve laterally surrounding respective portions of the first ends of the first, second, and third transmission lines.

4. The combiner/divider circuit of claim 3, wherein the first ferrite sleeve surrounds a portion of the signal-return conductors of the first, second, and third transmission lines that are connected together.

5. The combiner/divider circuit of claim 3, wherein the first ferrite sleeve also extends along at least a portion of the sixth transmission line.

6. The combiner/divider circuit of claim 3, further comprising a second ferrite sleeve laterally surrounding a portion of the fourth transmission line proximate the second end of the fourth transmission line; and a third ferrite sleeve laterally surrounding a portion of the fifth transmission line proximate the second end of the fifth transmission line.

7. The combiner/divider circuit of claim 6, further comprising a fourth ferrite sleeve laterally surrounding at least part of the sixth transmission line.

8. The combiner/divider circuit of claim 1, wherein the termination impedance includes a resistor.

9. The combiner/divider circuit of claim 1, wherein the termination impedance includes a coaxial cable.

10. The combiner/divider circuit of claim 1, further comprising a first strip transmission line having a planar signal conductor, the signal conductors of the third and fourth transmission lines at the second ends of the third and fourth transmission lines being connected at spaced locations to the planar signal conductor of the first strip transmission line.

11. The combiner/divider circuit of claim 10, further comprising a splitter having a common port connected to an intermediate portion of the planar signal conductor of the first strip transmission line and at least two split ports.

12. The combiner/divider circuit of claim 1, wherein the fourth and fifth transmission lines comprise strip lines having respective planar signal-return conductors, and the sixth transmission line is a slot line.

13. A combiner/divider circuit comprising:

a plurality of transmission lines, each of the transmission lines having a signal conductor and a signal-return conductor;

the signal conductor at one end of a first transmission line of the plurality of transmission lines being associated with a first component port, the signal conductor at one end of a second transmission line of the plurality of transmission lines being associated with a second component port, and the signal-return conductors at the other end of each of the first and second transmission lines being inductively coupled and forming a third transmission line of the plurality of transmission lines that conducts a difference signal that represents a difference between component signals appearing on the component ports;

the signal conductor at one end of a fourth transmission line of the plurality of transmission lines forming a sum port, and the signal conductor at the other end of the fourth transmission line being connected to the signal conductors at the other ends of the first and second transmission lines;

wherein the third transmission line is terminated by a termination impedance electrically connected between the signal-return conductors of the first and second transmission lines at a location spaced apart from the other ends of the first and second transmission lines.

14. The combiner/divider circuit of claim 13, wherein the signal-return conductor of the fourth transmission line at the other end of the fourth transmission line is electrically connected to the signal-return conductor at one end of a fifth transmission line of the plurality of transmission lines and the signal-return conductor at one end of a sixth transmission line of the plurality of transmission lines;

the signal conductor at the other end of the fifth transmission line being associated with the first component port; and the signal conductor at the other end of the sixth transmission line being associated with the second component port.

15. The combiner/divider circuit of claim 13, wherein the first, second, and fourth transmission lines comprise strip lines, and the third transmission line is a slot line.

16. A circuit comprising a magic tee hybrid having a plurality of transmission lines interconnected at a hybrid junction and forming a sum port, a first component port, a second component port, and a difference port;

a first transmission line of the plurality of transmission lines being associated with the difference port and being formed by a portion of a second transmission line of the plurality of transmission lines that is inductively coupled to a corresponding portion of a third transmission line of the plurality of transmission lines;

a terminating impedance element terminating the first transmission line at a location spaced apart from the hybrid junction; and the inductively coupled portions of the first and second transmission lines extending between the hybrid junction and the terminating impedance element.

17. The circuit of claim 16, wherein the magic tee hybrid further includes a first ferrite element through which extends a fourth transmission line of the plurality of transmission lines forming the sum port, and a second ferrite element extending around the first, second, and third transmission lines between the hybrid junction and the terminating impedance element.

* * * * *